(12) United States Patent
Kung

(10) Patent No.: US 6,767,673 B1
(45) Date of Patent: Jul. 27, 2004

(54) METHOD OF REPAIRING PSM TO KEEP NORMAL TRANSMISSION RATE AND PHASE ANGLE

(75) Inventor: Chun-Hung Kung, Hsin Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 258 days.

(21) Appl. No.: 09/993,069

(22) Filed: Nov. 14, 2001

(51) Int. Cl.⁷ .................................................. G03F 9/00
(52) U.S. Cl. ........................................................ 430/5
(58) Field of Search ..................... 403/5, 322; 216/66, 216/67

(56) References Cited

U.S. PATENT DOCUMENTS

| | | | |
|---|---|---|---|
| 5,382,484 A | 1/1995 | Hosono | 430/5 |
| 5,965,303 A | 10/1999 | Huang | 430/5 |
| 6,042,738 A | 3/2000 | Casey, Jr. et al. | 216/66 |
| 6,165,649 A * | 12/2000 | Grenon et al. | 430/5 |
| 6,207,328 B1 | 3/2001 | Lin | 430/5 |

* cited by examiner

*Primary Examiner*—S. Rosasco
(74) *Attorney, Agent, or Firm*—George O. Saile; Stephen B. Ackerman

(57) ABSTRACT

A new method is provided for the repair of a Phase Shifter Mask. The phase shifter of the PSM has been created over the active surface of the mask as a pattern of phase shift material, the pattern of phase shift material comprises at least one faulty element. A layer of photoresist is deposited over the active surface of the mask. A backside exposure of the PSM is performed in order to define the pattern of the mask in the layer of photoresist. The layer of photoresist is developed and remains in place over the pattern of the mask, protecting the phase shifter of the mask during repairs of the PSM. Repairs of the mask are performed using Focused Ion Beam techniques for this repair. A plasma etch removes Ga stain from the surface of the quartz substrate. The developed layer of photoresist is then removed from the pattern of the PSM using a wet strip process.

28 Claims, 3 Drawing Sheets

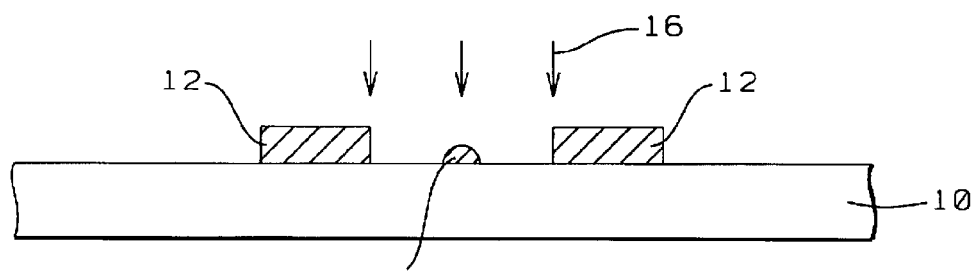
FIG. 1A – Prior Art
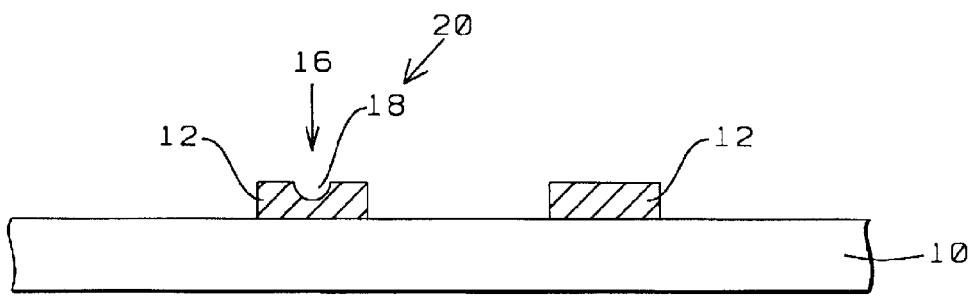
FIG. 1B – Prior Art
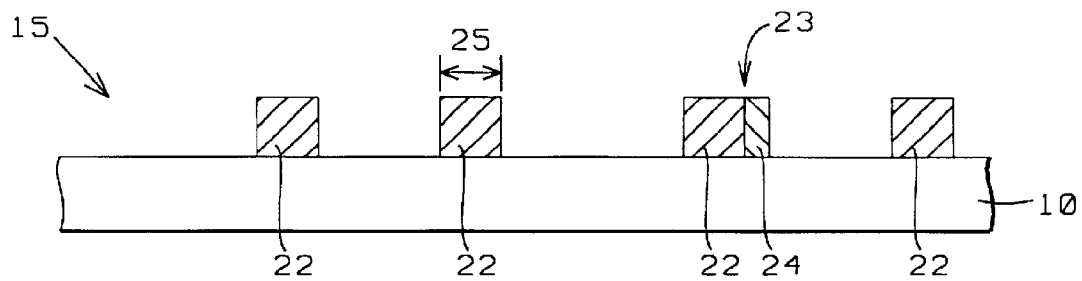
FIG. 2
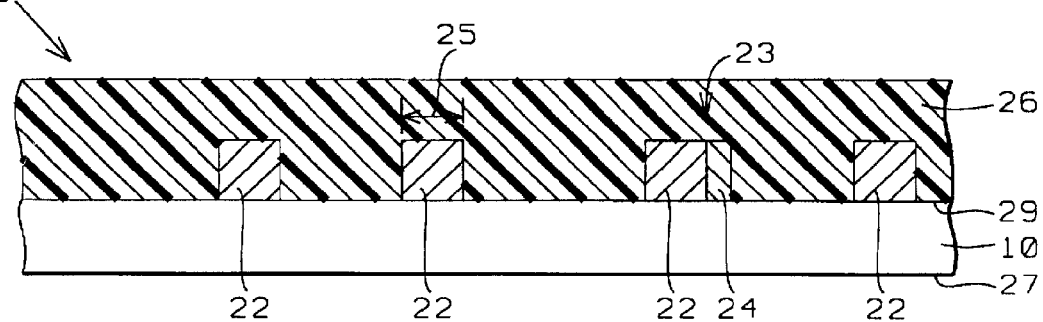
FIG. 3

METHOD OF REPAIRING PSM TO KEEP NORMAL TRANSMISSION RATE AND PHASE ANGLE

BACKGROUND OF THE INVENTION (1) Field of the Invention

The invention relates to the fabrication of integrated circuit devices, and more particularly, to a method of repairing Phase Shift Masks (PSM) such that a normal light transmission rate and light phase angle can be maintained.

(2) Description of the Prior Art

A photolithographic mask is one of the essential components that is used for creating patterns of exposure on semiconductor surfaces. The photolithographic mask contains a pattern of device features that must be transposed from the mask to underlying layers of semiconductor material such as for instance a layer of photoresist.

A standard photo mask contains a transparent substrate, typically made of quartz. A patterned layer of opaque material has been created over a surface of the transparent substrate. Chromium is typically used for the opaque material, deposited to a thickness of about 1,000 Angstrom. Alternate opaque materials for the creation of the patterned layer on the surface of a photolithographic mask are nickel and aluminum.

More sophisticated photo masks apply the principle of phase shifting of the light as the light passes through the mask. Phase shifting masks are used to create device features of sub-micron dimensions.

It is well known in the art that adjacent light beams, which are in extreme close proximity to each other while the light beams are used to create sub-micron device features, mutually influence each other, having a detrimental effect on the formation of the exposed pattern. The phase shift mask counteracts this mutual influence that closely spaced light beams have on each other.

As a further advance, alternate phase shifting masks can be used, where the phase shifting characteristic of the phase shifting mask is alternately affected as the light passes through the photo mask.

A further level of sophistication is introduced by the use of gray-tone masks where light passes through the photomask in a graded manner. Light passing characteristics of the gray-tone mask can be adjusted so that not only complete passing or complete blocking of light takes place but so that the mask provides a graded exposure that may for instance be of use in creating dual damascene structures, where depth of light exposure can be used for non-uniform removal of a layer of photoresist over the thickness of the layer of photoresist.

The photolithographic mask is created using conventional methods (including sputtering) of depositing a layer of opaque material over the substrate of the mask and patterning this layer using conventional high resolution methods of exposure such as E-beam exposure.

Due to the frequently used high density of the pattern that is developed in the layer of opaque material, this formation is exposed to a number of problems that result in bad and unusable masks.

These masks are frequently repaired, based on a cost analysis as to whether it is best (most cost effective) to repair the mask or whether it is best to scrap the defective mask. Some of the defects that can occur in the creation of an opaque pattern over the substrate are opaque material remaining in place where it should be removed and visa versa, the formation of an interconnect or bridge between closely spaced adjacent lines of the opaque pattern, extensions of the opaque material into transparent surface regions of the mask, the occurrence of an isolated opaque spot in a transparent region, the formation of pin holes in either the opaque or the transparent surface area, and the like.

A number of methods have been provided for the repair of photo masks, in view of the density and the potential complexity of the pattern that has been created on the substrate of the photo mask, this process however can be cumbersome, time consuming and expensive. The invention provides a method that is reliable and can be readily made part of a semiconductor manufacturing environment.

U.S. Pat. No. 5,965,303 (Huang) shows a method for fabricating a phase shift mask utilizing a defect repair tool.

U.S. Pat. No. 6,207,328 BI (Lin) shows a method for forming a phase shift mask.

U.S. Pat. No. 5,432,484 (Hosono) shows a method to correct defects in a PSM including Ga stains.

U.S. Pat. No. 6,042,738 (Casey et al.) discloses a pattern film repair method using a focused particle beam system.

SUMMARY OF THE INVENTION

A principle objective of the invention is to provide a method of repairing Phase Shift Masks (PSM) whereby the function of repair has no detrimental effect on the transmission rate and the phase angle of the PSM.

Another objective of the invention is to provide a method of repairing a PSM that avoids damage to the phase shifter of the mask.

Yet another objective of the invention is to provide a method of repairing a PSM whereby no permanent detrimental effect of a Ga stain on the quartz substrate of the mask is experienced.

In accordance with the objectives of the invention a new method is provided for the repair of a Phase Shifter Mask. The phase shifter of the PSM has been created over the active surface of the mask as a pattern of phase shift material, the pattern of phase shift material comprises at least one faulty element. A layer of photoresist is deposited over the active surface of the mask. A backside exposure of the PSM is performed in order to define the pattern of the mask in the layer of photoresist. The layer of photoresist is developed and remains in place over the pattern of the mask, protecting the phase shifter of the mask during repairs of the PSM. Repairs of the mask are performed using Focused Ion Beam techniques for this repair. A plasma etch removes Ga stain from the surface of the quartz substrate. The developed layer of photoresist is then removed from the pattern of the PSM using a wet strip process.

BRIEF DESCRIPTION OF THE DRAWINGS

FIGS. 1a and 1b show conventional methods that are used for the repair of a phase shift mask.

FIGS. 2 through 9 show the invention, as follows:

FIG. 2 is a cross section of a phase shift mask that has been provided with a pattern of phase shift material over a second surface of the mask. The pattern contains an incorrect pattern that must be repaired.

FIG. 3 is a cross section after the deposition of a layer of photoresist over the second surface of the phase shift mask on which the pattern of phase shift material has been created.

FIG. 4 shows a cross section during exposure of the first surface of the phase shift mask.

FIG. 5 shows a cross section after development of the exposed layer of photoresist.

FIG. 6 shows a cross section during repair of the incorrect pattern.

FIG. 7 shows a cross section after repair of the incorrect pattern.

FIG. 8 shows a cross section during plasma etch of the surface of the substrate of the phase shift mask.

FIG. 9 shows a cross section after the developed layer of photoresist has been removed from the surface of the pattern of phase shift material.

DESCRIPTION OF THE PREFERRED EMBODIMENTS

Figure 4:
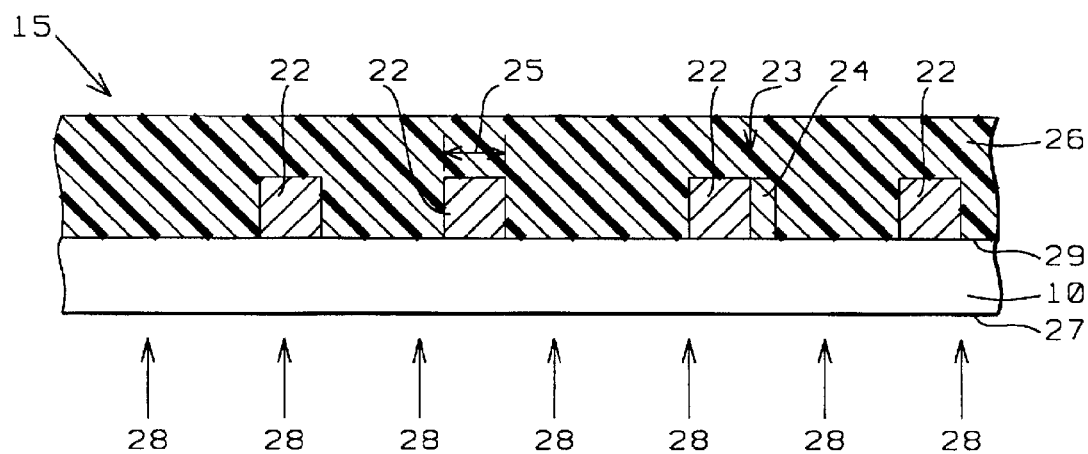

One of the major technologies that is used for the creation of semiconductor devices is the art of photolithography. Photolithography is used to create patterns of various designs in semiconductor surfaces. An UV or DUV light source is used to project the image of a mask onto a target surface. The target surface typically is a layer of photoresist, the mask that is used between the light source and the target surface contains regions of total light transparency and regions that block all light from passing through the mask. This latter characteristics results in energy (from the light source) being transmitted into the target surface which changes the chemical and molecular properties of the target surface. Photolithography provides a system of one or more optical lenses through which the light passes before striking the target surface. These lenses have as design objective to create the perfect reflection of the image that is contained in the mask onto the surface that is exposed by the light source.

Light of the energy source is transmitted to the target surface as waves of a particular frequency, amplitude and phase and as such is subjected to the laws of physics in its passage from source to target. Ideally all the light that strikes the target surface does so under the exact same conditions of frequency, amplitude, phase and angle of impact so that the image that is created in the target surface is uniform across that surface.

A serious problem in this respect of the effect of optical diffraction, whereby the light that impacts a surface does so under an angle that varies across the target surface. This effect becomes particularly severe where devices are created of micron or sub-micron dimensions, whereby any deviation from an ideal geometry of the created device features has a relatively larger impact. Reduced device feature size also brings with it the requirement for improved image resolution since the adjacency between device features across the surface of a semiconductor surface is likely to decrease with decreasing device feature size.

The resolution of the created image on a target surface is essentially determined by the optimum available numerical aperture of the lens system that is used for the image formation. Improving this performance parameter however is in conflict with the desire to achieve optimum depth of focus of the exposed image since the depth of focus of a lens system is inversely proportional with the numerical aperture of the lens system. To provide the required ideal image in a target surface, a number of corrective measures can be used that offset the undesirable characteristics of the system that is used to create this image. These corrective measures can make use of any or a combination of the parameters that play a role in the creation of the ideal image and that essentially already have been highlighted as light amplitude, frequency and phase. In addition, the method in which the image is created can be changed by for instance "pre-distorting" the image, that is creating an image before the process of exposure occurs that, when the distorting effects of the image formation are taken into account, forms an ideal image on the target surface or at least an image that is as close as possible to the ideal image. It is clear that these corrective measures are highly image dependent in the sense that, across the surface of a relatively large wafer, effects that are applied to the center of the wafer surface may have an entirely different effect at the perimeter of the wafer.

Light diffraction is the modification of light as it passes through opaque surfaces or through narrow slits and in which the light appears to be deflected and produces fringes of parallel light and dark or colored bands of light. The impact that light diffraction has on image formation where the images are of extremely small dimensions (0.5 microns or less) is therefore readily apparent in that light that is meant for a particular (small) areas readily "spills over" in an immediately adjacent (and equally small) area thus preventing sharp definitions of the two adjacent areas.

Phase control of the light that is used to create an image can be implemented by making use of the fact that the phase of the light that exits a surface (such as a photolithographic mask) can be made to relate to the phase of the light as it enters this surface whereby the parameter of control in adjusting this phase relationship is the thickness of the surface through which the light travels. By varying the thickness of the surface through which the light passes (that is having a surface that is not of uniform thickness) the phase of the light can be changed and therefore the amplitude of the light that exits the surface can be controlled (across the surface of for instance a photolithographic mask). The image that is created in this manner can therefore be adjusted or manipulated to compensate for any negative effects that are present in the imaging system. This latter approach may appear to be complex and difficult to implement were it not for the fact that most image processing systems are highly automated and are computerized to a large extent. The design parameters that affect ultimate image qualities can therefore readily be entered into a computer system where they become part of the appropriate support software and can change imaging rules and behavior for optimum results. A computer based design system also lends itself well to implementing requirements of mask exposure over relatively large surfaces and to make exposures that are dependent on the location within a large surface. This latter capability must be considered a basic requirement for any such automated or computer aided design system since most semiconductor devices are produced using large wafers and are mass produced whereby multiple device features are simultaneously created as part of one exposure sequence.

A number of conventional methods that are applied in order to correct PSM defects will be briefly highlighted following.

FIG. 1a shows a cross section of a mask substrate 10, typically comprising quartz or other silicate based substance, over the surface of which has been created a patterned layer 12 of opaque material, typically comprising Cr or MoSi. The defect that is shown in cross section in FIG. 1a is deposition 14, which is excess and random deposition of the opaque material also referred to as a black bump. This black bump can occur as a result of any interruption of the exposure that is performed for the creation of patterned layer 12. Black bump 14 is typically removed by evaporation, which is achieved by radiation 16, which can be a Nd: YAG laser beam with a wavelength of 532 nm and radiation energy of about 200 to 300 mJoule.

Where FIG. 1a shows an excess of light shifting material, the cross section of FIG. 1b shows a deficiency 18 of light shifting material, which also can be caused by any irregularity or interruption in the process of forming patterned layer 12 of phase shifting material. The deficiency 18 of phase shifter material is eliminated by a deposition 20 of a hydrocarbon based gas, filling and overlying the deficiency 18 with a deposit of the gas 20, which is then radiated by the Focused Ion Beam (FIB) exposure 16 to partially evaporate the hydrocarbon base film and to solidify part of this film inside deficiency 18.

It will be appreciated and specifically relating to phase shifter masks, that light that passes through black bump 14 of FIG. 1a undergoes a 180-degree shift in phase.

Since this light inversion takes place only for the light that passes through the black bump 14, this results in an interruption of phase shifting characteristics of the light that is projected through the PSM. The light that passes through black bump 14 essentially fails to expose the underlying layer (of for instance photoresist). The developed photoresist will therefore not be removed in accordance with the desired pattern, raising obvious concerns of product performance and the like.

Other considerations of repair apply to the repair of phase shifter mask, relating to for instance the size of the irregularities that are present in the phase shifter mask. Since however these concerns and considerations are not germane to the invention, they will not be further highlighted as part of the invention. Suffice it to be aware of the principles of some of the methods of repairing a phase shifter mask, a complete survey of these methods would be too lengthy an undertaking while making no substantial contribution to the invention.

The invention will now be described in detail using FIGS. 2 through 9.

Referring now specifically to the cross section that is shown in FIG. 2, highlighted in this cross section are:

15, a Phase Shift Mask that is used to further describe the invention 10, a substrate that is used for the creation of a PSM, typically comprising quartz or other silicate based substance 22, a pattern of shifter material of the PSM 15

23, an element of the pattern 22 that is defective 24, a defect in the pattern 22; in this case the defect 24 has been highlighted as being a width of pattern 23 that is in excess of the desired width 25 of the elements of the pattern 22

25, the desired width of the elements of pattern 22.

The cross section that is shown in FIG. 2 represents a standard PSM, a defect 24 is present in PSM 15 and must be repaired.

The cross section of FIG. 3 shows a layer 26 of photoresist deposited over the second surface 29 of substrate 10 over which phase shifter elements 22 have been formed. The first surface of substrate 10 has been highlighted as surface 27. The creation of layer 26 of photoresist uses conventional methods of photoresist deposition that do not need to be highlighted at this time. The thickness of the layer 26 of photoresist may vary between about 3,000 and 7,000 Angstrom and must essentially be adequate to form enough of a protective layer over elements 22 of the layer of phase shifter material. Since the layer 22 of opaque material is typically formed to a thickness of about 1,000 Angstrom, the indicated thickness of about 3,000 and 7,000 Angstrom of the layer 26 of photoresist meets the protective aspect requirement of this layer 26 of photoresist.

Layer 26 of photoresist typically comprises a disposable solid layer. Materials that are used for a layer of photoresist can comprise polymers such as polyamide, parylene or teflon (a polymer made from PTFE (polytetrafluoroethylene)), electron resist, solid organics or inorganics, BCB (bisbenzocyclobutene), PMMA (polymethylmethacrylate) and other polymers such as polycarbonate (PC), polysterene (PS), polyoxide (PO) and poly polooxide (PPO).

Optionally, the surface of layer 26 of photoresist can at this time, represented by the cross section shown in FIG. 3, be baked in order to provide improved protection for the underlying elements 22 of phase shift material. This step of baking the layer 26 of photoresist can be performed using a temperature in the range between 300 and 700 degrees C., under atmospheric pressure, for a time between about 10 and 30 seconds.

FIG. 4 shows a cross section during exposure 28, using UV light as a light source, with a wavelength of 193 and 248 $\mu$m and a radiation energy of about 400 to 700 mJoule, of the first surface 27 of the substrate 10. Since substrate 10 is, by its very nature in the application of this substrate for the creation of a PSM, a transparent substrate, light energy provided by radiation 28 penetrates substrate 10, imparting its energy to the layer 26 of photoresist. It will thereby however be realized that the light that penetrates to layer 26 is not universally allowed to penetrate layer 26 across the width of the surface 29 of substrate 10. This is because light 28 is blocked from this penetration by phase shift elements 22, including the incorrect element 24. Layer 26 is therefore exposed to light 28 and subsequently converted to a removable substance only for that portion of the layer 26 of photoresist for which light exposure 28 is not blocked by elements 22 and 24. The layer 26 of photoresist will therefore remain in place overlying the elements 22 and 24 after the layer 26 of photoresist has been developed. This is shown in cross section in FIG. 5.

Figure 5:
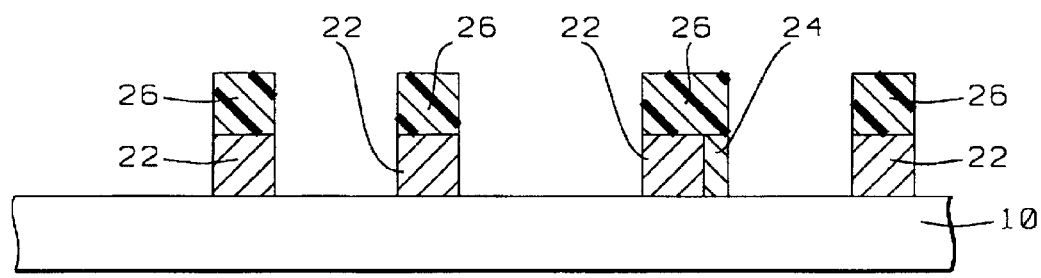

The cross section of FIG. 5 shows that the PSM is now ready for repair which is performed using conventional methods of Focused Ion Beam (FIB) repair, with the developed layer 26 of photoresist protecting the layer 22 and 24 of shifter material. The FIB repair method focuses the ion beam 31, FIG. 6, on the region 24 of required repair, however scattered Ga ions will as yet impact the surface of the substrate 10. Focused Ga ions will also impact the substrate 10 underlying the area of repair at the completion of the repair activity, this effect of impact however can be limited by precise control of the repair action. During the repair action, affected by FIB 31, FIG. 6, the developed layer 26 of photoresist protects the pattern 22 of phase shifter material.

Figure 6:
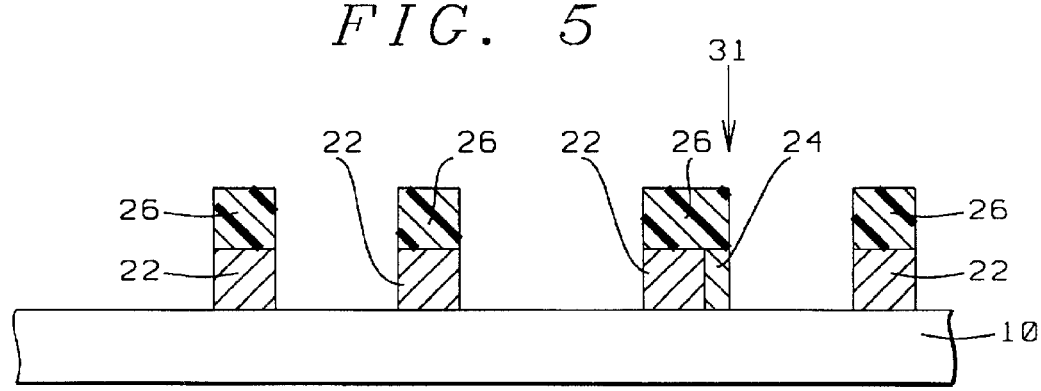
Figure 7:
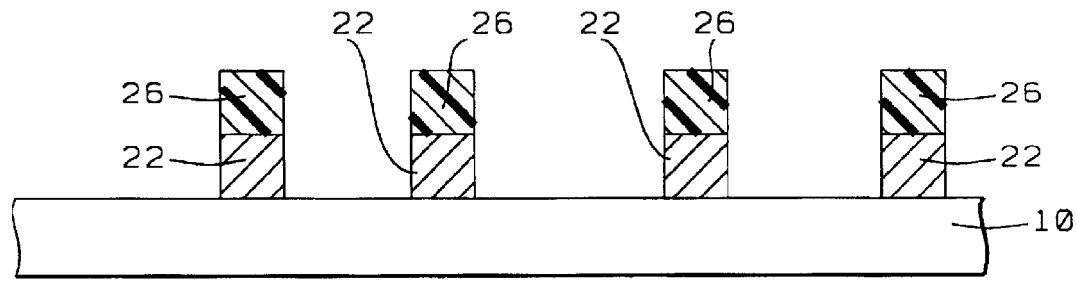
Figure 8:
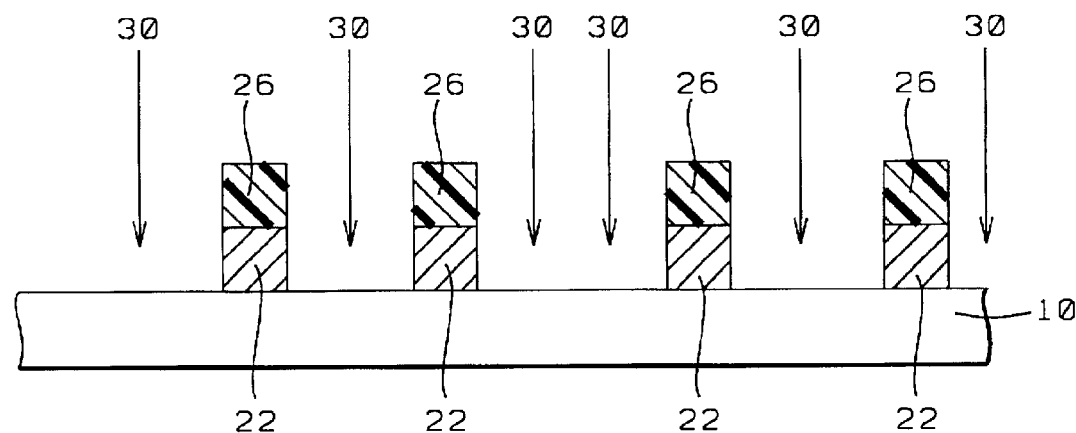

The completion of the repair action is shown in cross section in FIG. 7 with the removal of the excess width of layer 24, shown in the cross section of FIG. 6, from the surface of substrate 10. At this time the effect of the Ga implants into the surface of substrate 10 must be removed, which is achieved by applying an oxygen plasma etch 30 to substrate 10, shown in the cross section of FIG. 8, by heating substrate 10 in a highly oxidized environment. Substrate 10 is baked at a temperature of about 400 degrees C. with a range of about 350 to 450 degrees C., under a pressure of about 450 Torr with a range between about 400 and 500 Torr, with $O_3$ plasma flow of about 5,000 sccm/min with a range of about 4,000 to 6,000 sccm/min.

Plasma etch 30 restores the surface of substrate 10 where the Ga has impacted this surface by removing an upper layer of surface 29 of substrate 10. The removal of an upper layer of substrate 10 does have an impact on the phase angle of the PSM but this impact has been observed as being small enough so that the PSM still performs within the limits of the performance specifications of the PSM 15.

Figure 9:
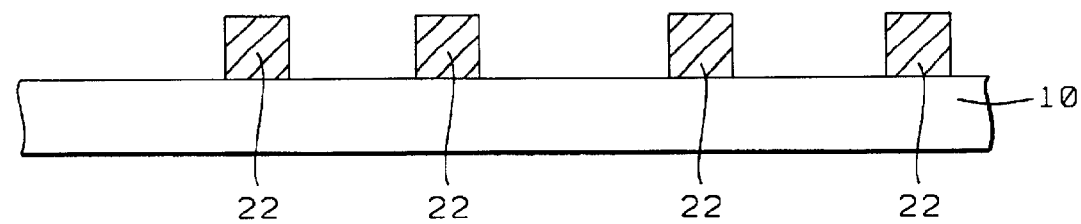

As a final step, the invention removes the developed layer 26 of photoresist from the surface of the pattern 22 of opaque material by applying a wet strip, creating a repaired PSM 15, which is shown in the cross section of FIG. 9.

Sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts of 30% $H_2O_2$ or a mixture of 88% sulfuric acid and 12% nitric acid. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 26 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

It is clear that the method of the invention for repairing PSM mask 15, as described using FIGS. 2 through 9, comprises:

the pattern 22 of opaque shifter elements having been protected by a layer of photoresist during the repair operation, avoiding problems of impacting the transmission characteristics of the shifter and impacting the phase angle characteristics of the PSM, and the Ga stain has been removed from the surface of the substrate 10.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of repairing a Phase Shift Mask (PSM), while maintaining desired transmission rate and phase angle of the PSM, comprising the steps of:

providing a Phase Shift Mask (PSM) having a first and a second surface, said PSM having been provided with a pattern of phase shifter material over the second surface of said PSM, said pattern of phase shifter material comprising at least one faulty element;

depositing a layer of photoresist over the second surface of said Phase Shift Mask, including the surface of said pattern of phase shifter material provided over the second surface of said PSM;

exposing the first surface of said PSM, thereby exposing said deposited layer of photoresist except where said layer of photoresist is shielded by said pattern of phase shifter material provided over the second surface of said PSM;

developing said exposed layer of photoresist, removing said layer of photoresist from in between said pattern of phase shifter material over the second surface of said PSM, leaving said layer of photoresist in place overlying said pattern of phase shifter material including said at least one faulty element;

repairing said at least one faulty element present in said pattern of phase shifter material;

removing Ga stain from the second surface of said PSM; and removing said developed layer of photoresist from the surface of said pattern of phase shifter material.

2. The method of claim 1, wherein said patterned layer of phase shifter material has a thickness of about 1,000 Angstrom.

3. The method of claim 1, wherein said layer of photoresist is deposited to a thickness within the range of about 3,000 and 7,000 Angstrom.

4. The method of claim 1, wherein said exposing the first surface of said PSM comprises UV exposure with a wavelength of 193 or 248 µm, and a radiation energy within the range of about 400 to 700 mJoule.

5. The method of claim 1, wherein said repairing said at least one faulty element present in said pattern of phase shifter material comprises Focused Ion Beam technology.

6. The method of claim 1, wherein said removing Ga stain from the second surface of said PSM comprises applying an oxygen plasma etch to the second surface of said PSM.

7. The method of claim 6, wherein said plasma etch comprises heating said surface of said PSM in a highly oxidized environment under a temperature and a pressure with a plasma flow being provided.

8. The method of claim 7, said temperature being in the range of about 350 to 450 degrees C.

9. The method of claim 7, said pressure being in the range between about 400 and 500 Torr.

10. The method of claim 7, said plasma flow being a $O_3$ plasma flow within the range of about 4,000 to 6,000 sccm/min.

11. The method of claim 1, with an additional step of baking the deposited layer of photoresist, said additional step being performed after said step of depositing a layer of photoresist over the second surface of said Phase Shift Mask.

12. The method of claim 11, wherein said step of baking the deposited layer of photoresist comprises applying a temperature in the range between 300 and 700 degrees C., under atmospheric pressure, for a time between about 10 and 30 seconds.

13. The method of claim 1, said Phase Shift Mask (PSM) comprising a quartz substrate.

14. A method of repairing a Phase Shift Mask (PSM), while maintaining desired transmission rate and phase angle of the PSM, comprising the steps of:

providing a Phase Shift Mask (PSM) having a first and a second surface, said PSM having been provided with a pattern of phase shifter material over the second surface of said PSM, said pattern of phase shifter material comprising at least one faulty element;

creating a layer of protective semiconductor material over the surface of said pattern of phase shifter material provided over the second surface of said PSM, including the surface of said at least one faulty element in said pattern of phase shifter material;

repairing said at least one faulty element in said pattern of phase shifter material;

removing a Ga stain from the second surface of said PSM; and removing said layer of protective layer of semiconductor material from the surface of said pattern of phase shifter material provided over the second surface of said PSM.

15. The method of claim 14, said layer of protective semiconductor material comprising photoresist.

16. The method of claim 14, said creating a layer of protective semiconductor material over the surface of said pattern of phase shifter material provided over the second surface of said PSM including the surface of said at least one faulty element in said pattern of phase shifter material comprising the steps of:

depositing a layer of protective semiconductor material over the second surface of said Phase Shift Mask, including the surface of said pattern of phase shifter material provided over the second surface of said PSM;

exposing the first surface of said PSM, thereby exposing said deposited layer of protective semiconductor material except where said layer of protective semiconductor material is shielded by said pattern of phase shifter material provided over the second surface of said PSM; and developing said exposed layer of protective semiconductor material, removing said layer of protective semiconductor material from in between said pattern of phase shifter material over the second surface of said PSM, leaving said layer of protective semiconductor material in place overlying said pattern of phase shifter material including said at least one faulty element.

17. The method of claim 14, wherein said pattern of phase shifter material over the second surface of said PSM has thickness of about 1,000 Angstrom.

18. The method of claim 14, wherein said layer of protective semiconductor material is deposited to a thickness within the range of about 3,000 and 7,000 Angstrom.

19. The method of claim 14, wherein said exposing the first surface of said PSM comprises UV exposure with a wavelength of 193 or 248 $\mu$m, and a radiation energy within the range of about 400 to 700 mJoule.

20. The method of claim 14, wherein said repairing said at least one faulty element present in said pattern of phase shifter material comprises Focused Ion Beam technology.

21. The method of claim 14, wherein said removing Ga stain from the second surface of said PSM comprises applying an oxygen plasma etch to the second surface of said PSM.

22. The method of claim 21, wherein said plasma etch comprises heating said surface of said PSM in a highly oxidized environment under a temperature and a pressure with a plasma flow being provided.

23. The method of claim 22, said temperature being in the range of about 350 to 450 degrees C.

24. The method of claim 22, said pressure being in the range between about 400 and 500 Torr.

25. The method of claim 22, said plasma flow being a $O_3$ plasma flow within the range of about 4,000 to 6,000 sccm/min.

26. The method of claim 14, with an additional step of baking the deposited layer of protective semiconductor material, said additional step being performed after said step of creating a layer of protective semiconductor material over the surface of said pattern of phase shifter material provided over the second surface of said PSM.

27. The method of claim 26, wherein said step of baking the deposited layer of protective semiconductor material comprises applying a temperature in the range between 300 and 700 degrees C., under atmospheric pressure, for a time between about 10 and 30 seconds.

28. The method of claim 14, said Phase Shift Mask (PSM) comprising a quartz substrate.

* * * * *